(12) United States Patent
Hashizume et al.

(10) Patent No.: US 11,083,103 B2
(45) Date of Patent: Aug. 3, 2021

(54) ELECTRONIC MODULE

(71) Applicant: BROTHER KOGYO KABUSHIKI KAISHA, Nagoya (JP)

(72) Inventors: Taiki Hashizume, Kariya (JP); Makoto Souda, Nagoya (JP)

(73) Assignee: BROTHER KOGYO KA BUSH IKI KAISHA, Nagoya (JP)

( * ) Notice: Subject to any disclaimer, the term of this patent is extended or adjusted under 35 U.S.C. 154(b) by 0 days.

(21) Appl. No.: 16/295,481

(22) Filed: Mar. 7, 2019

(65) Prior Publication Data

US 2019/0307013 A1   Oct. 3, 2019

(30) Foreign Application Priority Data

Mar. 27, 2018   (JP) .............................. JP2018-060645

(51) Int. Cl.
| | |
|---|---|
| *H05K 7/20* | (2006.01) |
| *H05K 7/14* | (2006.01) |
| *H05K 1/02* | (2006.01) |
| *H05K 5/03* | (2006.01) |
| *H05K 1/18* | (2006.01) |

(52) U.S. Cl.
CPC ......... *H05K 7/1422* (2013.01); *H05K 1/0204* (2013.01); *H05K 1/181* (2013.01); *H05K 5/03* (2013.01); *H05K 7/2039* (2013.01); *H05K 7/20909* (2013.01); *H05K 2201/064* (2013.01); *H05K 2201/066* (2013.01); *H05K 2201/10174* (2013.01)

(58) Field of Classification Search
None
See application file for complete search history.

(56) References Cited

U.S. PATENT DOCUMENTS

| 5,844,312 A * | 12/1998 | Hinshaw | H01L 23/4093 257/718 |
|---|---|---|---|
| 6,252,773 B1 * | 6/2001 | Werner | H01L 23/4093 165/185 |
| 6,515,858 B2 * | 2/2003 | Rodriguez | H05K 7/20909 165/104.33 |
| 6,665,183 B1 * | 12/2003 | Shikata | H05K 7/20918 257/721 |
| 7,185,696 B2 * | 3/2007 | Schaper | H01L 23/40 165/185 |

(Continued)

FOREIGN PATENT DOCUMENTS

| JP | 7-122836 A | 5/1995 |
|---|---|---|
| JP | 2004-93708 A | 3/2004 |

(Continued)

*Primary Examiner* — Courtney L Smith
(74) *Attorney, Agent, or Firm* — Merchant & Gould P.C.

(57) ABSTRACT

An electronic module includes a circuit board having a mounting surface; a heat generating component mounted on the mounting surface; a frame supporting the circuit board; a cover covering the heat generating component and the mounting surface; and a heatsink mounted on the mounting surface. The heatsink includes at least one wall including a particular wall to which the heat generating component is attached. The heatsink further includes a shade portion provided at the at least one wall. The shade portion is located between the cover and the heat generating component in a direction perpendicular to the mounting surface.

16 Claims, 10 Drawing Sheets

(56) References Cited

U.S. PATENT DOCUMENTS

| | | | |
|---|---|---|---|
| 7,505,274 B2* | 3/2009 | Yu | H01L 23/4006 |
| | | | 165/80.3 |
| 7,800,901 B2* | 9/2010 | Borowy | B23K 9/32 |
| | | | 165/104.33 |
| 7,817,426 B2* | 10/2010 | Tamori | H05K 7/2049 |
| | | | 165/185 |
| 2003/0112602 A1* | 6/2003 | Lin | H01L 23/367 |
| | | | 361/707 |
| 2004/0096229 A1 | 5/2004 | Yoshihara et al. | |
| 2017/0257985 A1 | 9/2017 | Souda | |
| 2018/0052275 A1* | 2/2018 | Lee | G02B 6/0055 |

FOREIGN PATENT DOCUMENTS

| | | |
|---|---|---|
| JP | 2005-86149 A | 3/2005 |
| JP | 2006-222304 A | 8/2006 |
| JP | 2017-156636 A | 9/2017 |
| WO | 2008-114381 A1 | 9/2008 |

* cited by examiner

ELECTRONIC MODULE

CROSS-REFERENCE TO RELATED APPLICATION

This application claims priority from Japanese Patent Application No. 2018-060645 filed on Mar. 27, 2018, the content of which is incorporated herein by reference in its entirety.

FIELD OF DISCLOSURE

Aspects described herein relate to an electronic module including a circuit board and electronic components mounted on the circuit board.

BACKGROUND

A known electronic module includes a circuit board and electronic components mounted on the circuit board. The electronic components may include a heat generating component, such as a rectifier diode. The heat generating component may be a potential ignition source. A safety standard, such as IEC62368-1, prescribes requirements for reducing a likelihood that heat generating components cause property damages.

To satisfy the requirements of the safety standard, a surface of the circuit board, on which electronic components are mounted, may be covered or surrounded by a metallic cover, or flame-retardant resin may be used for a frame that supports the circuit board including the electronic components.

SUMMARY

Use of relatively expensive flame-retardant resin may increase costs of the electronic module.

One or more aspects of the disclosure provide a cost-saving electronic module. According to one or more aspects of this disclosure, an electronic module includes a circuit board, a heat generating component, a frame, a cover, and a heatsink. The circuit board has a mounting surface, a first side, and a second side perpendicular to the first side. The heat generating component is mounted on the mounting surface of the circuit board. The frame includes non-flame-retardant resin. The frame extends in a direction perpendicular to the mounting surface and supports the first side of the circuit board. The frame has a frame surface. The cover includes metal. The cover extends in a direction parallel to the second side of the circuit board and covers the heat generating component and the mounting surface. The heatsink is mounted on the mounting surface of the circuit board adjacent to the first side. The heatsink includes at least one wall including a particular wall to which the heat generating component is attached. The heatsink further includes a shade portion provided at the at least one wall. The shade portion is located between the cover and the heat generating component in a direction perpendicular to the mounting surface.

According to one or more aspects of this disclosure, a power supply circuit board module includes a circuit board, a first frame, a second frame, a rectifier diode, an upper cover, and a heatsink. The circuit board has a mounting surface. The first frame includes flame-retardant resin. The second frame is made of non-flame-retardant resin. The rectifier diode is mounted on the mounting surface of the circuit board. A distance between the rectifier diode and the second frame is less than a distance between the rectifier diode and the first frame. The upper cover extends between the first frame and the second frame, and is connected to the first frame and the second frame. The heatsink is mounted on the mounting surface of the circuit board. The heatsink includes a particular wall to which the rectifier diode is attached. The heatsink further includes a shade portion located between the upper cover and the rectifier diode. The shade portion extends from the particular wall.

DETAILED DESCRIPTION

Referring to FIGS. 1-10, an illustrative embodiment will be described below.

[Configuration of Image Forming Apparatus]

Figure 1:
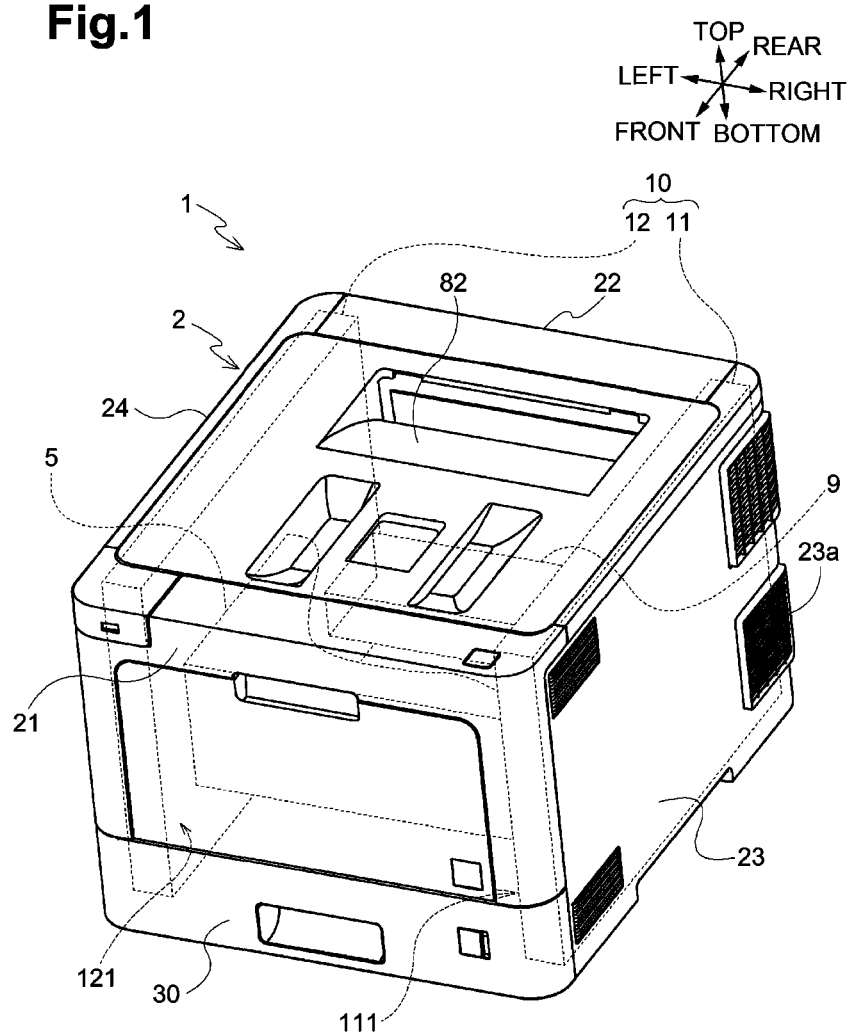
FIG. 1 is a perspective view of an image forming apparatus including right and left frames and a power supply unit in an illustrative embodiment according to one or more aspects of the disclosure.
Figure 2:
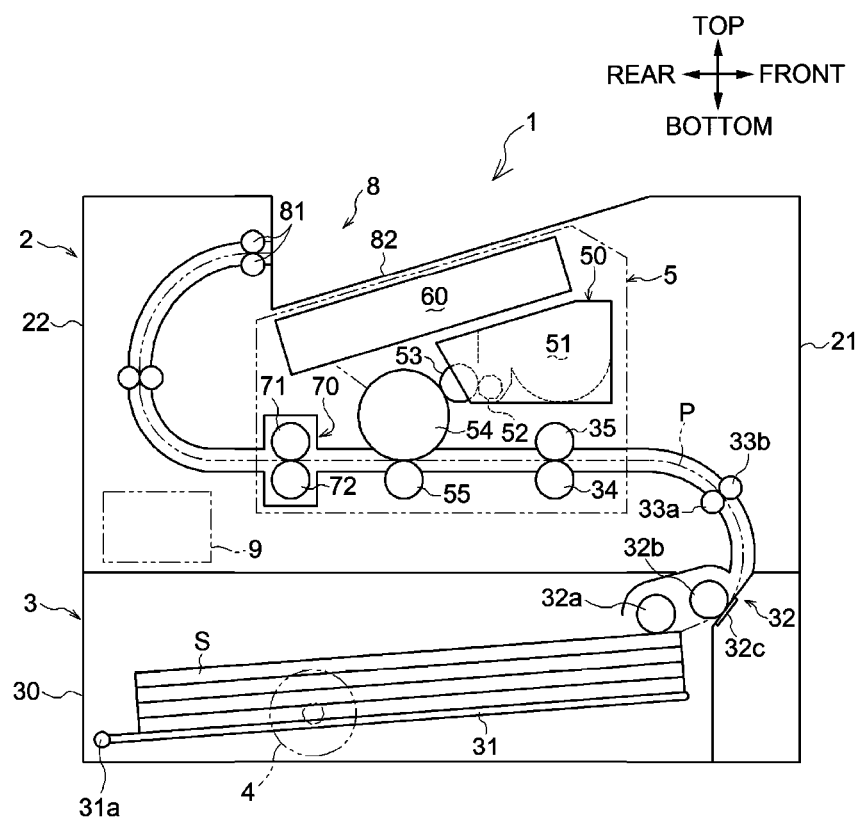
FIG. 2 is a side sectional view of the image forming apparatus.

Referring to FIGS. 1 and 2, an image forming apparatus 1 includes a casing 2, a motor 4, a sheet feed unit 3, an image forming unit 5, a sheet output unit 8, and an electronic module including a power supply unit 9 and a main body frame 10.

Respective directions of front, rear, left, right, top/up, and bottom/down are defined in conjunction with an orientation in which the image forming apparatus 1 is intended to be used, as depicted in FIGS. 1 and 2. With respect to the page of FIG. 2, the right side may be defined as the front; the left side may be defined as the rear; the facing or near side may be defined as the left; the opposite side or far side may be defined as the right; the upper side may be defined as the top; and the lower side may be defined as the bottom. Because the disclosed components can be positioned in a number of different orientations, the directional terminology is used for purposes of illustration and is in no way limiting.

The casing 2 has a substantially rectangular parallelepiped shape. The casing 2 houses therein various units and components, such as the sheet feed unit 3, the image forming unit 5, the sheet output unit 8, the motor 4, the power supply unit 9, and the main body frame 10.

The casing 2 includes a front cover 21, a rear cover 22, a right cover 23 and a left cover 24 that are respectively disposed at a front surface, a rear surface, a right surface and a left surface of the casing 2.

In the casing 2, a sheet conveying path P is defined. The sheet conveying path P extends from the sheet feed unit 3 to the sheet output unit 8 through the image forming unit 5.

The motor 4 is a drive source for supplying drive force to, for example, rollers.

The sheet feed unit 3 includes a sheet cassette 30, a sheet feed mechanism 32, a conveying roller 33a, and a registration roller 34.

The sheet feed unit 3 is disposed at a lower portion of the image forming apparatus 1. The sheet feed unit 3 is configured to feed, to the image forming unit 5, each of one or more sheets S held in the sheet cassette 30.

The sheet cassette 30 is configured to be attached to or detached from a lower portion of the casing 2. The sheet cassette 30 has a fully attached position and a separated position. The sheet cassette 30 may be inserted into the casing 2 in a front-to-rear direction, reaching the fully attached position. The sheet cassette 30 in the fully attached position may be pulled in a rear-to-front direction toward the separated position. In the separated position, the sheet cassette 30 is at least partially separated from the casing 2. The sheet cassette 30 is configured to slidably move between the fully attached position and the separated position.

The sheet cassette 30 includes a sheet support plate 31 that supports a stack of one or more sheets S. The sheet support plate 31 may be driven by the motor 4 to pivotally move about a pivot 31a in an upward direction, to a sheet feedable position (e.g., position depicted in FIG. 1). In the sheet feedable position, the sheet stack, if any, is in contact with a pick-up roller 32a (described below), and a topmost sheet S is allowed to be fed from the stack.

The sheet feed mechanism 32 is configured to separate the sheets S held in the sheet cassette 30 one by one, and to feed each sheet S toward the conveying roller 33a. The sheet feed mechanism 32 includes the pick-up roller 32a, a separation roller 32b, and a separation pad 32c.

The pick-up roller 32a is configured to pick up the sheets S on the sheet support plate 31 located at the sheet feedable position. The separation roller 32b is disposed downstream of the pick-up roller 32a in a sheet conveying direction. The separation pad 32c faces the separation roller 32b and is urged toward the separation roller 32b.

The sheets S picked by the pick-up roller 32a are fed toward the separation roller 32b, and separated one by one between the separation roller 32b and the separation pad 32c. Each sheet S is conveyed toward the conveying roller 33a.

The conveying roller 33a is configured to apply force to the sheet S such that the sheet S is conveyed in the sheet conveying direction. The conveying roller 33a is disposed downstream of the sheet feed mechanism 32 in the sheet conveying direction. The conveying roller 33a faces a paper dust removing roller 33b. The sheet S fed from the sheet feed mechanism 32 toward the conveying roller 33a is held between the rollers 33a and 33b, and is conveyed toward the registration roller 34.

The registration roller 34 is disposed downstream of the conveying roller 33a in the sheet conveying direction. The registration roller 34 faces a pinch roller 35. The registration roller 34 is configured to convey the sheet S, whose leading end is temporarily stopped at a position between the registration roller 34 and the pinch roller 35, toward a transfer position at a predetermined timing.

The image forming unit 5 is disposed downstream of the sheet feed unit 3 in the sheet conveying direction. The image forming unit 5 is configured to form an image on the sheet S conveyed from the sheet feed unit 3.

The image forming unit 5 includes a process cartridge 50 including a photosensitive drum 54; an exposure unit 60; and a fixing unit 70. The process cartridge 50 is configured to transfer an image to a surface of the sheet S fed from the sheet feed unit 3. The exposure unit 60 is configured to selectively expose a surface of the photosensitive drum 54 with light. The fixing unit 70 is configured to fix the image transferred by the process cartridge 50 onto the sheet S.

The process cartridge 50 is disposed in the casing 2 above the sheet feed unit 3. The process cartridge 50 includes a developer chamber 51, a supply roller 52, a developer roller 53, the photosensitive drum 54, and a transfer roller 55.

The exposure unit 60 includes a laser diode, a polygon mirror, a lens, and a reflecting mirror. The exposure unit 60 is configured to emit laser light to the photosensitive drum 54 based on image data received by the image forming apparatus 1, such that the surface of the photosensitive drum 54 is selectively exposed to the light.

The developer chamber 51 contains developer, e.g., toner. The toner in the developer chamber 51 is conveyed to the supply roller 52 while being agitated by an agitator (not depicted). The supply roller 52 is configured to supply the toner from the developer chamber 51 to the developer roller 53.

The developer roller 53 is disposed in contact with the supply roller 52. The developer roller 53 is configured to carry thereon the toner, which is supplied from the supply roller 52 and is positively charged. A positive developing bias is applied to the developer roller 53 by a bias application device (not depicted).

The photosensitive drum 54 is disposed adjacent to the developer roller 53. The surface of the photosensitive drum 54 is uniformly and positively charged by a charger (not depicted) and then exposed to the light from the exposure unit 60. A portion of the photosensitive drum 54 exposed to the light has a lower potential than the remaining portion of the drum 54. The portion has an electrostatic latent image formed based on the image data.

The positively charged toner may be supplied from the developer roller 53 to the surface of the photosensitive drum 54 having the electrostatic latent image formed thereon. The electrostatic latent image is thus developed into a visible developer image.

The transfer roller 55 is disposed facing the photosensitive drum 54. The transfer roller 55 is applied with a negative transfer bias by a bias application device (not depicted). The developer image on the surface of the photosensitive drum 54 may be transferred onto a surface of the sheet S while the sheet S is nipped and conveyed through a transfer position between the photosensitive drum 54 and the transfer roller 55, whose surface is applied with the transfer bias.

The fixing unit 70 includes a heat roller 71 and a pressure roller 72. The heat roller 71 is configured to be rotated by the drive force from the motor 4 and to be heated with power supply from the power supply unit 9. The pressure roller 72 is disposed facing the heat roller 71. The pressure roller 72 is configured to be rotated by the rotation of the heat roller 71. The pressure roller 72 is in contact with the heat roller 71 when rotating. The sheet S having the developer image transferred thereon is conveyed to the fixing unit 70, where the developer image may be thermally fixed to the sheet S while the sheet S is nipped and conveyed through a portion between the heat roller 71 and the pressure roller 72.

The sheet output unit 8 is disposed downstream of the image forming unit 5 in the sheet conveying direction. The sheet output unit 8 is configured to output the sheet S having an image formed thereon by the image forming unit 5, to an exterior of the image forming apparatus 1.

The sheet output unit 8 includes sheet output rollers 81 and a sheet output tray 82. The sheet output rollers 81 are configured to output the sheet S conveyed from the fixing unit 70 out of the casing 2. The sheet output tray 82 is provided at an upper surface of the casing 2. The sheet output tray 82 is configured to receive the sheet S output by the sheet output rollers 81 to an exterior of the casing 2.

The power supply unit 9 is configured to supply power to the motor 4, the image forming unit 5, and others. The power supply unit 9 is disposed in the casing 2 to the rear of the image forming unit 5. The power supply unit 9 may supply a low-voltage power.

[Main Body Frame]

The main body frame 10 is disposed in the casing 2. The main body frame 10 includes a right frame 11 and a left frame 12. The left frame 12 is an example of a claimed "frame."

The right and left frames 11 and 12 are plate-like members disposed facing each other in the left-right direction with a space therebetween. The right frame 11 is located at a position adjacent to the right cover 23. The right frame 11 extends along the right cover 23 in the top-bottom direction (e.g., vertical direction), as well as in the front-rear direction. The left frame 12 is located at a position adjacent to the left cover 24. The left frame 12 extends along the left cover 24 in the top-bottom direction (e.g., vertical direction), as well as in the front-rear direction. The right frame 11 includes a right frame surface 111 extending in the top-bottom direction, as well as in the front-rear direction. The left frame 12 includes a left frame surface 121 extending in the top-bottom direction, as well as in the front-rear direction.

The image forming unit 5 and the power supply unit 9 are disposed between the right frame 11 and the left frame 12, and are supported by the frames 11 and 12.

The main body frame 10, which includes the right frame 11 and the left frame 12, includes resin or plastic.

Figure 3:
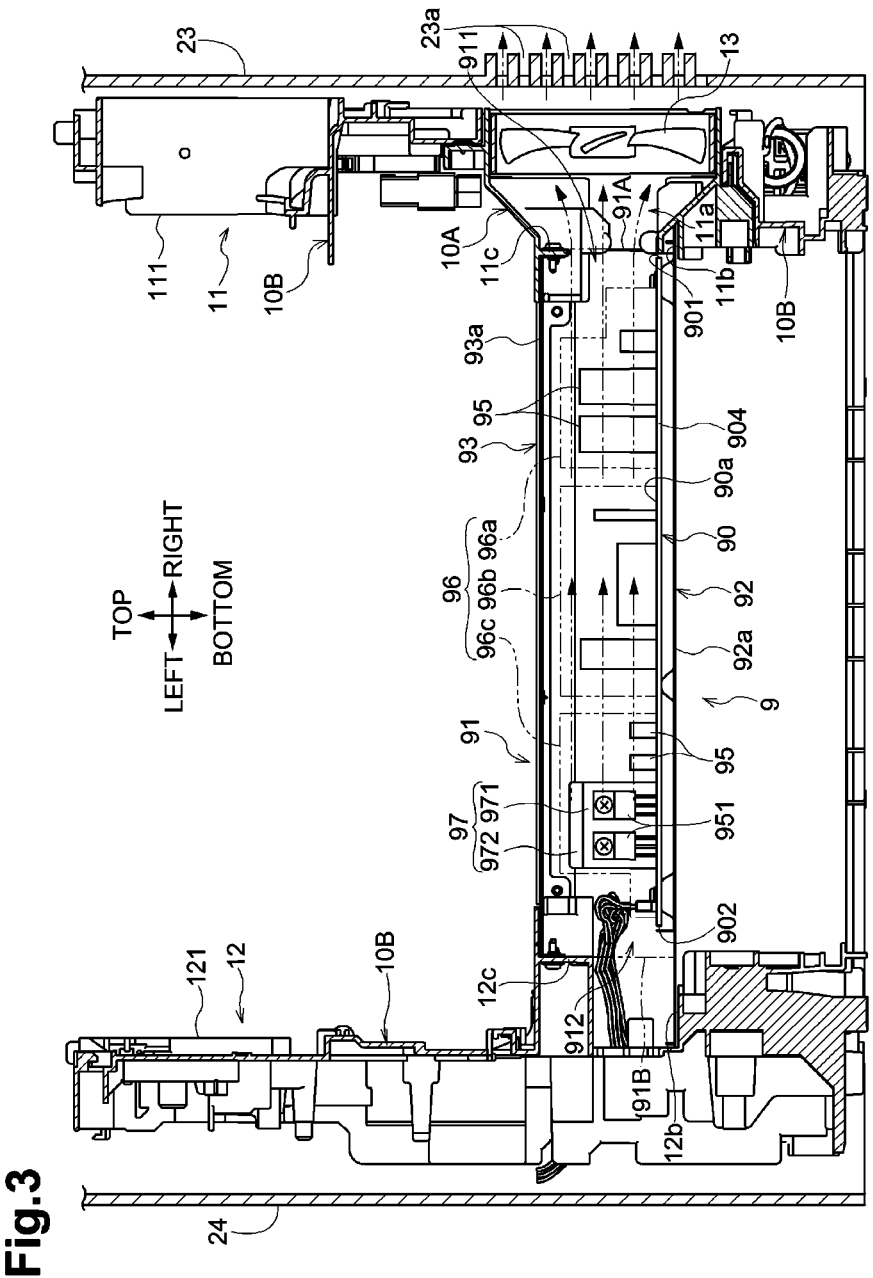
FIG. 3 is a front sectional view of the power supply unit supported by the right and left frames.

As depicted in FIG. 3, the right frame 11 includes a first frame portion 10A and a second frame portion 10B. The first frame portion 10A includes flame retardant resin having a first flame retardancy. The second frame portion 10B includes non-flame-retardant resin having a second flame retardancy. The second flame retardancy is lower than the first flame retardancy. The left frame 12 is entirely made of non-flame-retardant resin having the second flame retardancy.

The first frame portion 10A may include flame retardant resin having a flame retardancy equal to or higher than the UL94-5VB rating specified in the UL standard. Examples of such flame retardant resin may include polycarbonate resin.

The second frame portion 10B and the left frame 12 may include non-flame-retardant resin having a flame retardancy equivalent to the UL94-HB rating specified in the UL standard. The UL94 standard is a plastics flammability standard released by Underwriters Laboratories of the United States.

The right frame 11 has an opening 11a extending therethrough in the left-right direction. The opening 11a is located at a rear portion of the right frame 11.

The first frame portion 10A of the right frame 11 surrounds the opening 11a. In other words, the opening 11a is formed in the first frame portion 10A of the right frame 11.

In the opening 11a of the right frame 11, a fan 13 is disposed to discharge the air inside the casing 2 to an exterior of the casing 2 through discharge ports 23a formed through the right cover 23.

[Electronic Module]

The electronic module includes the main body frame 10 and the power supply unit 9, as described above.

Figure 4:
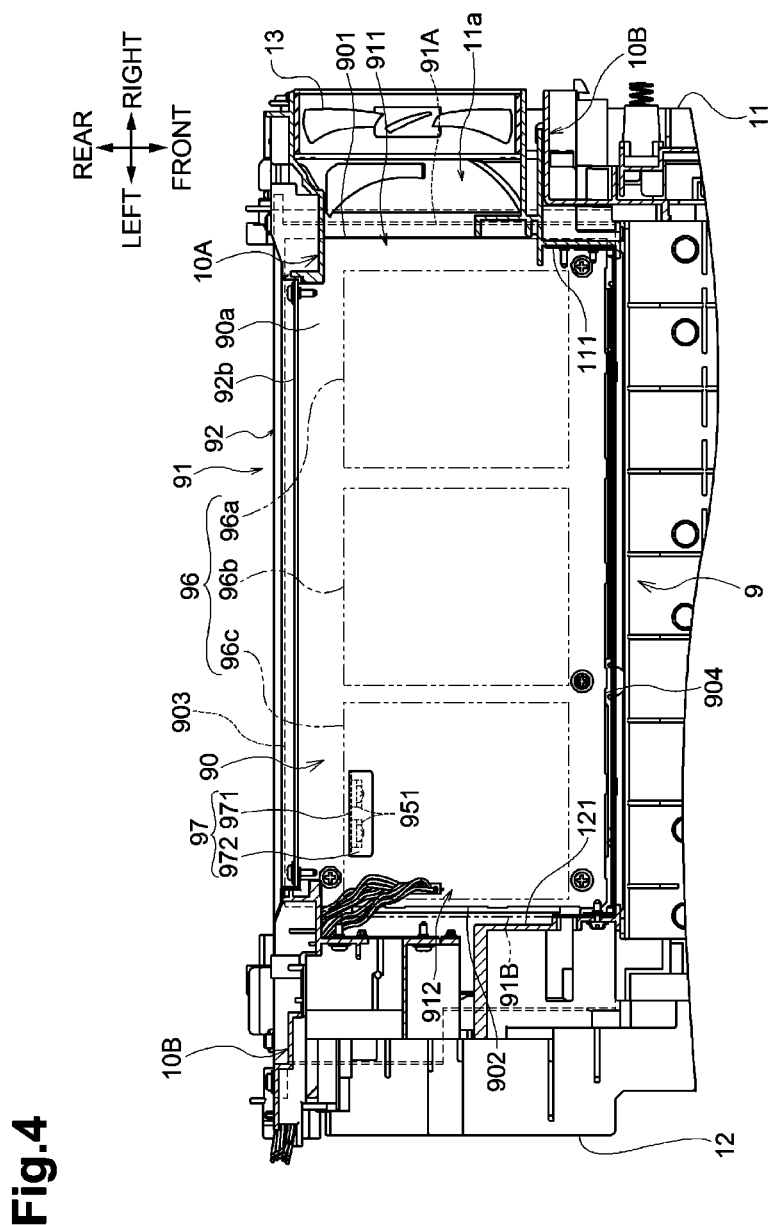
FIG. 4 is a top sectional view of the power supply unit supported by the right and left frames.
Figure 5:
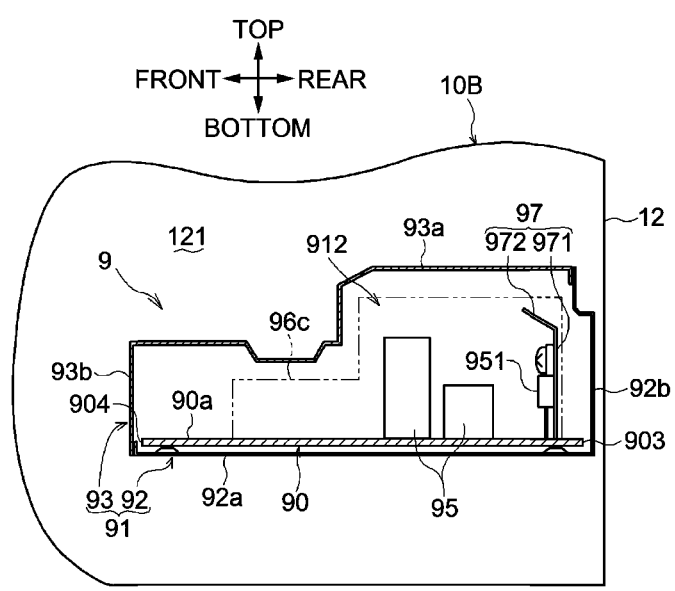
FIG. 5 is a side sectional view of the left frame and the power supply unit.
Figure 6:
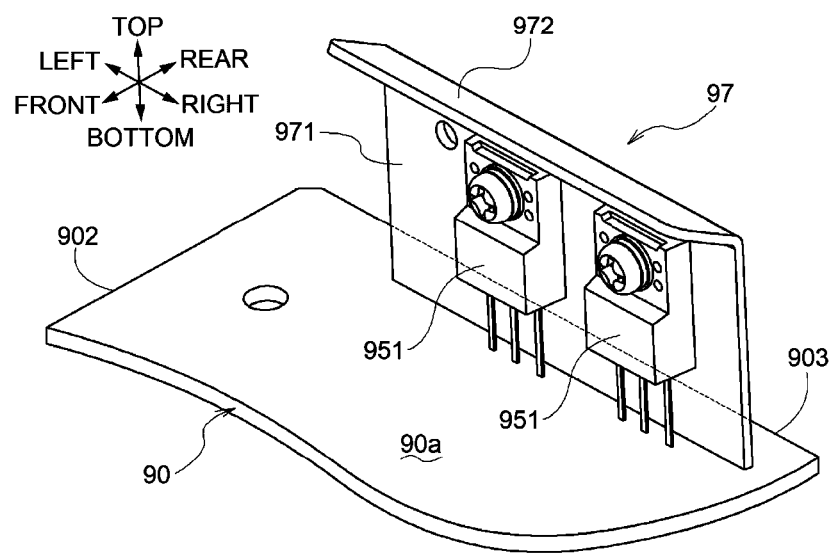
FIG. 6 is a perspective view of a heatsink and a rectifier diode mounted on a power supply board of the power supply unit, illustrating an example of an arrangement of the heatsink and the rectifier diode.

As depicted in FIGS. 3-5, the power supply unit 9 includes a circuit board, e.g., a power supply board 90, and a cover 91. The power supply board 90 has a mounting surface 90a on which electronic components 95 are mounted. The mounting surface 90a may extend horizontally. The mounting surface 90a may be perpendicular to the left frame surface 121 of the left frame 12.

The cover 91 includes metal. The cover 91 covers or surrounds the mounting surface 90a and the electronic components 95 mounted on the mounting surface 90a.

The cover 91 includes a lower cover 92 and an upper cover 93. The lower cover 92 supports the power supply board 90 such that the mounting surface 90a faces upward.

The lower cover 92 includes a lower cover portion 92a and a rear cover portion 92b. The lower cover portion 92a supports the power supply board 90 such that at least a lower surface of the power supply board 90 is covered from below. The rear cover portion 92b is disposed to the rear of the power supply board 90 and the electronic components 95. The upper cover 93 includes an upper cover portion 93a and a front cover portion 93b. The upper cover portion 93a is disposed over the power supply board 90 and the electronic components 95. The front cover portion 93b is disposed to the front of the power supply board 90 and the electronic components 95.

The lower cover 92 and the upper cover 93 are connected to each other. The lower and upper covers 92 and 93 cover or surround the power supply board 90 and the electronic components 95 from above and below, as well as from the front and the rear. The front cover portion 93b, the upper cover portion 93a, and the rear cover portion 92b cover or surround the mounting surface 90a and the electronic components 95 mounted on the mounting surface 90a.

The power supply board 90 has a rectangular shape whose longitudinal direction may correspond to the left-right direction. The power supply board 90 has a right side 901 and a left side 902 that extend in the front-rear direction, and a rear side 903 and a front side 904 that extend in the left-right direction. The right side 901 is located closer to the right fame 11 than the left side 902 in the left-right direction. The left side 902 is located closer to the left frame 12 than the right side 901 in the left-right direction. The left side 902 is an example of a claimed "first side" of the circuit board. The rear side 903 and the front side 904 are examples of a claimed "second side" of the circuit board. The left side 902 extends in the front-rear direction that intersects the left-right direction in which the rear and front sides 903 and 904 extend. In one example, the right side 901 may be located in correspondence with a right end of the cover 91 (e.g., a right open surface 91A to be described below); the left side 902 may be located in correspondence with a left end of the cover 91 (e.g., a left open surface 91B to be described below); the rear side 903 may be located in correspondence with the rear cover portion 92b; the front side 904 may be located in correspondence with the front cover portion 93b.

The cover 91 extends in the left-right direction parallel to the rear and front sides 903 and 904 of the power supply board 90.

A right end portion of the cover 91 is supported by the right frame 11 while a left end portion of the cover 91 is supported by the left frame 12.

In one example, the right frame 11 has a support groove 11b that supports the right end portion of the lower cover 92 (e.g., the lower cover portion 92a). The left frame 12 has a support portion 12b that supports the left end portion of the lower cover 92 (e.g., the lower cover portion 92a).

The right frame 11 includes a fixing portion 11c to which a right end portion of the upper cover portion 93a of the upper cover 93 is fixed. The left frame 12 also includes a fixing portion 12c to which a left end portion of the upper cover portion 93a is fixed The cover 91 is thus supported by the right and left frames 11 and 12. In detail, the right frame 11 supports the right end portion of the power supply board 90 including the right side 901, via the cover 91, and the left frame 12 supports the left end portion of the power supply board 90 including the left side 902, via the cover 91.

The cover 91 has the right open surface 91A and the left open surface 91B on right and left ends of the cover 91, respectively. The right open surface 91A has a right opening 911. The left open surface 91B has a left opening 912. In short, the cover 91 has the open surfaces 91A and 91B at ends in a direction parallel to the rear side 903 and the front side 904 of the power supply board 90. The right open surface 91A is located at an end (e.g., the right end) of the cover 91 corresponding to the right side 901 of the power supply board 90. The left open surface 91B is located at an end (e.g., the left end) of the cover 91 corresponding to the left side 902 of the power supply board 90. The open surfaces 91A and 91B are parallel to the left frame surface 121 of the left frame 12.

The power supply 9 includes power supply circuitry 96 including circuits formed on the power supply board 90 and the electronic components 95 mounted on the mounting surface 90a. The power supply circuitry 96 includes a primary circuit 96a, a transformer circuit 96b, and a secondary circuit 96c. The primary circuit 96a is configured to receive voltage from an external power supply. The transformer circuit 96b is configured to transform the voltage received from the external power supply into a predetermined voltage. The secondary circuit 96c is configured to output the predetermined voltage to the image forming unit 5.

The primary circuit 96a, the conversion circuit 96b, and the secondary circuit 96c may be arranged in this order in a right-to-left direction (e.g., a direction from the right frame 11 to the left frame 12).

The primary circuit 96a is disposed at a right portion of the power supply board 90 to the right of the conversion circuit 96b. The conversion circuit 96b is disposed at a central portion of the power supply board 90 in the left-right direction. The secondary circuit 96c is disposed at a left portion of the power supply board 90 to the left of the conversion circuit 96b. The primary circuit 96a is located adjacent to the first frame portion 10A of the right frame 11. The secondary circuit 96c is located adjacent to the left frame 12, which is constituted as the second frame portion 10B.

The power supply board 90 includes the electronic components 95, and a heatsink 97, both being mounted on the mounting surface 90a. As depicted in FIGS. 3-6, the secondary circuit 96 includes a heat generating component e.g., a rectifier diode 951, which is attached to the heatsink 97. The rectifier diode 951 is mounted on the mounting surface 90a such that a distance between the rectifier diode 951 and the left frame 12 is less than a distance between the rectifier diode 951 and the right frame 11. The heatsink 97 is configured to radiate heat conducted from the rectifier diode 951. The heatsink 97 may include metal, such as aluminum. Although FIG. 4 does not show other electronic components 95 than the rectifier diode 951, several other electronic components may also be mounted on the mounting surface 90a.

The heatsink 97 is disposed at a left end portion of the power supply board 90. The heatsink 97 includes a wall 971 and a shade portion 972.

The wall 971 has a surface on which the rectifier diode 951 is screwed, and whereby the rectifier diode 951 closely contacts the surface of the wall 971. The wall 971 may extend in the top-bottom direction or in a direction perpendicular to the mounting surface 90a, as well as in the left-right direction. In other words, the wall 971 is perpendicular to the left open surface 91B of the cover 91 and the mounting surface 90a.

The shade portion 972 obliquely extends frontward from an upper end of the wall 971. In other words, the shade portion 972 is disposed at an upper end of the wall 971. Additionally, the shade portion 972 is angled, relative to a direction parallel to the mounting surface 90a, in a direction away from the mounting surface 90a, from an upper end of the wall 971. The shade portion 972 is inclined from the bottom to the top such that a top portion of the shade portion 972 extends farther toward the front than a bottom portion of the shade portion 972.

The shade portion 972 may form any angle with the wall 971, as long as the shade portion 972 is angled, relative to a horizontal direction, in an upward direction from an upper end of the wall 971. The shade portion 972 may be formed by bending or curving an upper end portion of the wall 971.

In the cover 91, the shade portion 972 is disposed above the rectifier diode 951, covering the rectifier diode 951. The shade portion 972 is provided at the upper end of the wall 971 such that the shade portion 972 extends through a portion between the upper cover portion 93a of the upper cover 93 and the rectifier diode 951. In other words, the shade portion 972 is located between the upper cover portion 93a and the rectifier diode 951 in a direction perpendicular to the mounting surface 90a.

The cover 91 shades the rectifier diode 951, which is a heat generating component and may be a potential ignition source. The cover 91 functions as a shield or barrier against the heat from the rectifier diode 951.

The heatsink 97, on which the rectifier diode 951 is screwed, includes the shade portion 972, which is located between the cover 91 and the rectifier diode 951. Such heatsink 97 may also be a shield or barrier against the heat from the rectifier diode 951. This configuration may reduce or eliminate a region affected by the heat from the rectifier diode 951.

With the cover 91 and the heatsink 97, the left frame 12 may be less affected by heat from the rectifier diode 951 even if the left frame 12, which is located near the rectifier diode 951, is made of non-flame-retardant resin. Use of non-flame-retardant resin for the left frame 12 may reduce the costs of the electronic module.

In a case where a heatsink does not include a shade portion, the left frame 12 could be much affected by heat from the rectifier diode 951. Further, if the left frame 12 is made of non-flame-retardant resin, the left frame 12 might have to be spaced from the rectifier diode 951 by a certain distance, which may increase the size of the electronic module.

The heatsink 97 in this embodiment includes the shade portion 972 that functions as a shield or a barrier against the heat from the rectifier diode 951. As compared with a heatsink that does not include a shade portion, the heatsink 97 in this embodiment may allow the rectifier diode 951 to be located closer to the left frame 12, which may be made of non-flame-retardant resin. This may require less space in the electronic module.

The shade portion 972 is angled, relative to the horizontal direction, in an upward direction from an upper end of the wall 971. An angle of the shade portion 972 relative to the wall 971 may be determined, as desired, to allow the shade portion 972 to function as a shield or a barrier against the heat from the rectifier diode 951. This may reduce or eliminate a region affected by the heat from the rectifier diode 951.

The fan 13 is disposed in the opening 11a of the right frame 11 to discharge the air inside the casing 2 to an exterior of the casing 2. Driving the fan 13 may generate air flow in the cover 91 in the left-right direction from the left opening 912 toward the right opening 911. Such air flow in the cover 91 may cool down the electronic components 95 on the power supply board 90.

The air flow in the left-right direction out of or into the cover 91 through the openings 911 or 912 may efficiently radiate the heat in the wall 971, on which the rectifier diode 951 is screwed, that extends in the left-right direction, as well as in the top-bottom direction.

The rectifier diode 951 screwed to the wall 971 may be located close to or adjacent to the cover 91 disposed in parallel with the rear side 903 and the front side 904 of the power supply board 90. This configuration may reduce or eliminate a region affected by the heat from the rectifier diode 951. This configuration may also allow the rectifier diode 951 to be located close to the left opening 912 of the cover 91 such that the distance between the rectifier diode 951 and the left opening 912 is minimized. This configuration may require less space in the electronic module.

The heatsink 97 as depicted in FIGS. 3-6 is mounted on the mounting surface 90a such that the wall 971 is perpendicular to the left open surface 91B of the cover 91 and the mounting surface 90a.

Figure 7A:
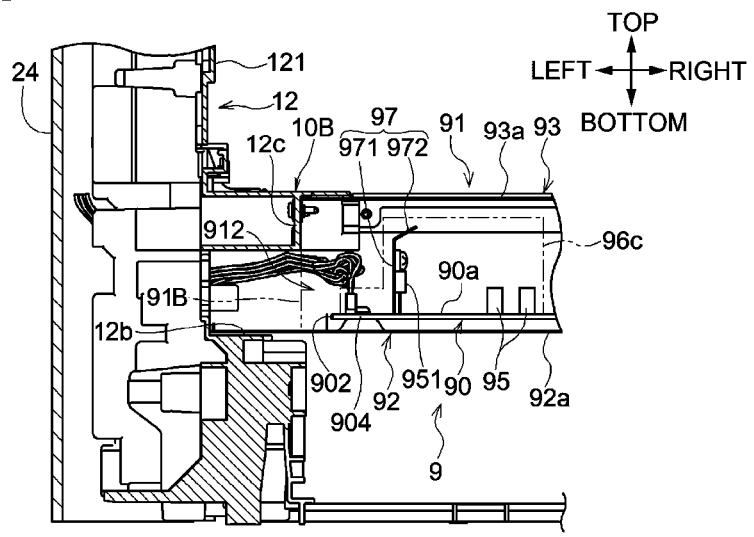
FIG. 7A is a partially enlarged front sectional view of the left frame and the power supply unit, illustrating another example of an arrangement of the heatsink and the rectifier diode on the power supply board.
Figure 7B:
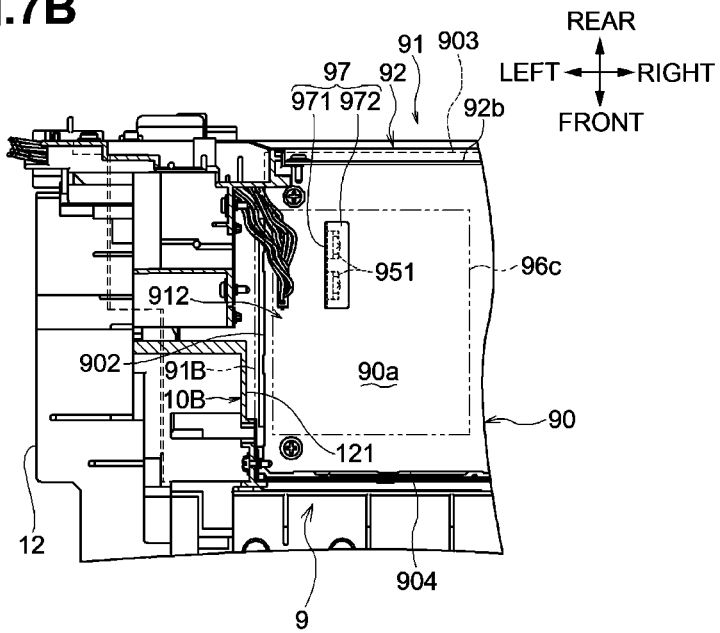
FIG. 7B is a partially enlarged top sectional view of the left frame and the power supply unit, illustrating the other example of the arrangement of the heatsink and the rectifier diode on the power supply board.
Figure 8A:
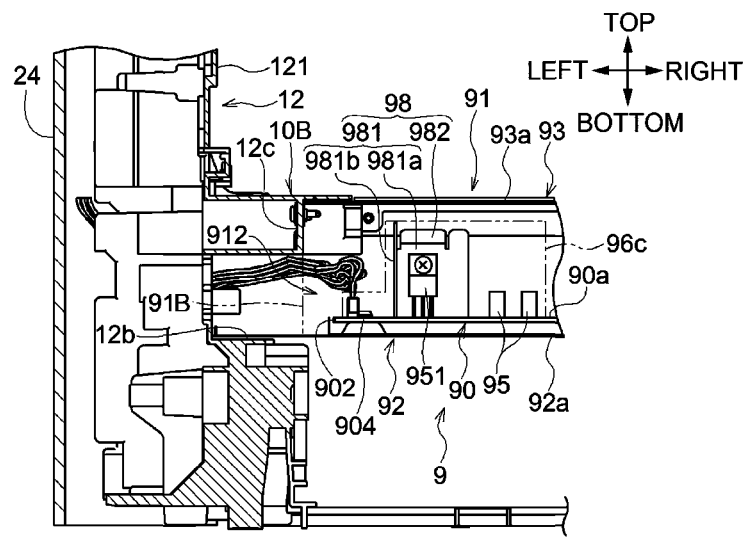
FIG. 8A is a partially enlarged front sectional view of the left frame and the power supply unit, illustrating a variation of a heatsink mounted on the power supply board.
Figure 8B:
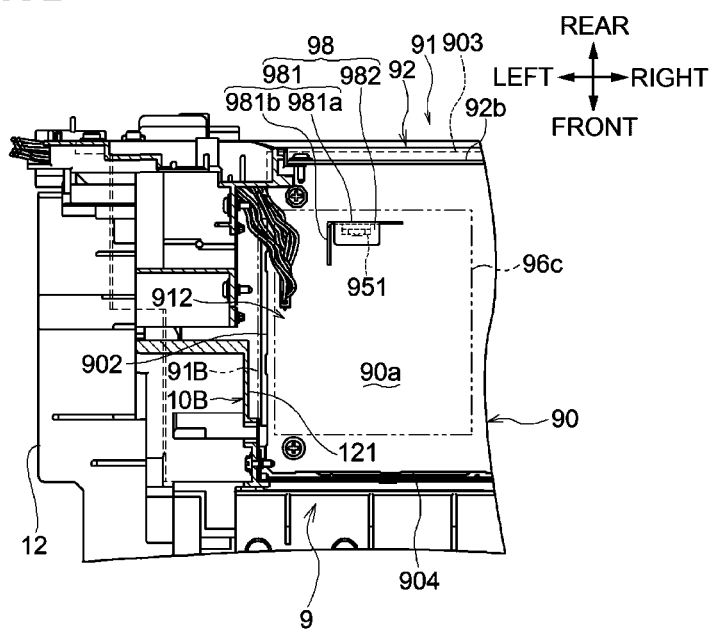
FIG. 8B is a partially enlarged top sectional view of the left frame and the power supply unit, illustrating the variation of the heatsink on the power supply board.
Figure 9:
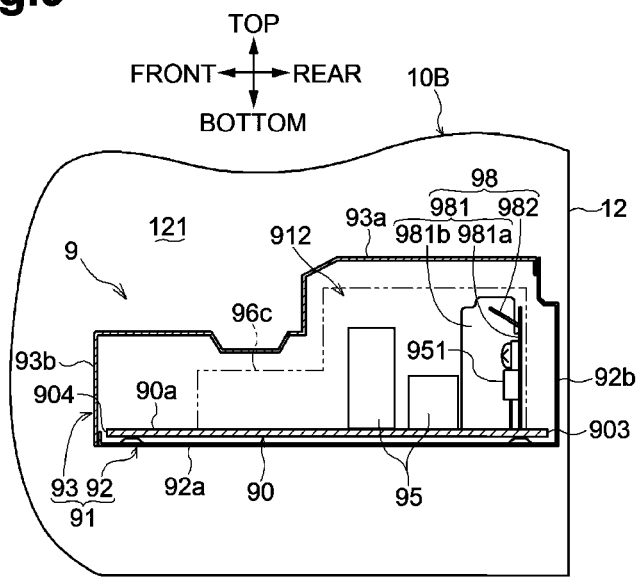
FIG. 9 is a side sectional view of the variation of the heatsink on the power supply board.
Figure 10:
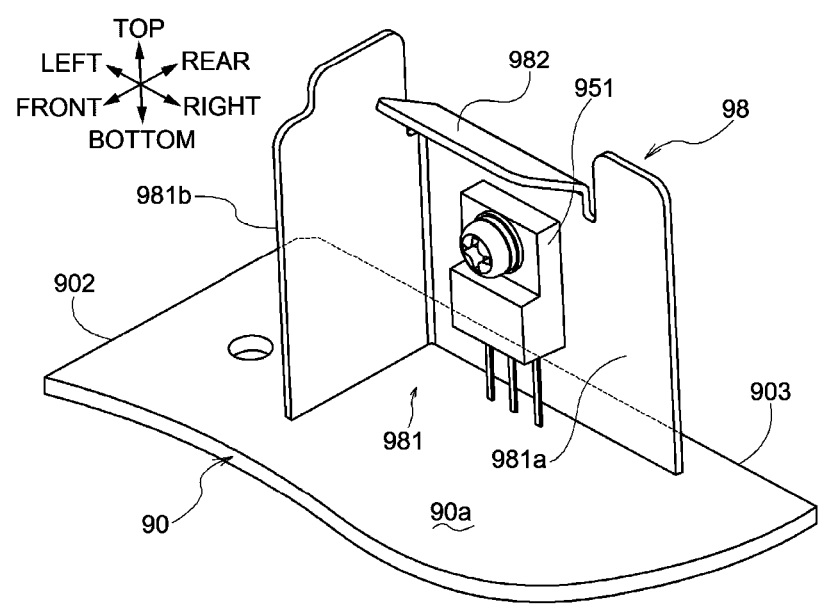
FIG. 10 is a perspective view of the variation of the heatsink and the rectifier diode on the power supply board.

Alternatively, the heatsink 97 may be mounted on the mounting surface 90a, as depicted in FIGS. 7A and 7B, such that the wall 971 is parallel to the left open surface 91B of the cover 91 and perpendicular to the mounting surface 90a. In short, the heatsink 97 may be mounted on the mounting surface 90a such that the wall 971 extends along the front-rear direction (e.g., a longitudinal direction of the wall 971 corresponds to the front-rear direction). In this configuration, the heatsink 971 is disposed between the left open surface 91B of the cover 91 and the rectifier diode 951 in the left-right direction.

The wall 971 of the heatsink 971 extends along the front-rear direction. The wall 971 faces the left opening 912 of the cover 91 and functions as a shield or a barrier. This configuration may reduce such chance that the heat from the rectifier diode 951 affects the left frame 12 through the left opening 912 of the cover 91.

Since the left frame 12 disposed facing the left opening 912 of the cover 91 may be less affected by the heat from the rectifier diode 951, it would be reasonable to use non-flame-retardant resin in the left frame 12, thereby reducing the costs of the electronic module. The arrangement of the heatsink 97 depicted in FIGS. 7A and 7B may allow the left frame 12 made of non-flame-retardant resin to not be enough spaced from the left opening 912 of the cover 91. This configuration may require less space in the electronic module.

[Variations of Heatsink]

Instead of the heatsink 97, a heatsink 98 as depicted in FIGS. 8A-10 may be used.

The heatsink 98 is mounted on a left end portion of the mounting surface 90a of the power supply board 90. The heatsink 98 includes walls 981 and a shade portion 982. The walls 981 include a first wall 981a and a second wall 981b.

The first wall 981a extends in the top-bottom direction or in a direction perpendicular to the mounting surface 90a, as well as in the left-right direction. The first wall 981a has a surface on which the rectifier diode 951 is screwed. The first wall 981a is perpendicular to the left open surface 91B of the cover 91 and the mounting surface 90a.

The second wall 981b extends in the top-bottom direction or in a direction perpendicular to the mounting surface 90a, as well as the front-rear direction. The second wall 981b is perpendicular to the first wall 981a and the mounting surface 90a. The second wall 981b is parallel to the left open surface 91B of the cover 91. The second wall 981b is located between the left open surface 91B and the rectifier diode 951 in the left-right direction.

The second wall 981b extending along the front-rear direction faces the left opening 912 of the cover 91, and functions as a shield or a barrier.

The first and second walls 981a and 981b may be formed from a flat piece of metal, for example, by bending or curving the metal piece.

The shade portion 982 obliquely extends frontward from an upper end of the first wall 981a. In other words, the shade portion 982 is disposed at an upper end of the first wall 981a. Additionally, the shade portion 982 is angled, relative to a direction parallel to the mounting surface 90a, in a direction away from the mounting surface 90a, from an upper end of the first wall 981a. The shade portion 982 is inclined from the bottom to the top such that a top portion of the shade portion 982 extends farther toward the front than a bottom portion of the shade portion 982.

The shade portion 982 may form any angle with the first wall 981a, as long as the shade portion 982 is angled, relative to the horizontal direction, in an upward direction from the upper end of the first wall 981a. The shade portion 982 may be formed, for example, by bending or curving an upper end portion of the first wall 981a.

The shade portion 982 is disposed above the rectifier diode 951, shading the rectifier diode 951. The shade portion 982 may be provided at at least a portion of the upper end of the first wall 981a such that the shade portion 982 extends between the upper cover portion 93a of the upper cover 93 and the rectifier diode 951. In other words, the shade portion 982 is located, for functioning as a shield, between the upper cover portion 93a and the rectifier diode 951 in a direction perpendicular to the mounting surface 90a.

The heatsink 98 includes the shade portion 982 that functions as a shield or a barrier against the heat generated by the rectifier diode 951. This configuration may reduce or eliminate a region affected by the heat from the rectifier diode 951. The heatsink 98 further includes the second wall 981*b* that faces the left opening 912 of the cover 90 and functions as a shield or a barrier. This configuration may further reduce or eliminate a region affected by the heat from the rectifier diode 951.

Accordingly, the left frame 12 disposed facing the left opening 912 of the cover 91 may be less affected by the heat from the rectifier diode 951. This may allow the left frame 12 to include non-flame-retardant resin, thereby reducing the costs of the electronic module. Further, as compared with a heatsink that does not include a second wall 981*b*, the heatsink 98 may allow the rectifier diode 951 to be located closer to the left frame 12, which may be made of non-flame-retardant resin. This may require less space in the electronic module.

The shade portion 982 of the heatsink 98 may be formed, for example, by bending or curving an upper end portion of the first wall 981*a*. In another embodiment, a shade portion 982 may be formed by bending or curving an upper end portion of the second wall 981*b*. In yet another embodiment, a shade portion 982 may be formed by bending or curving an upper end portion of each of the first wall 981*a* and the second wall 981*b*.

The heatsink 98 may be mounted on the mounting surface 90*a* such that the first wall 981*a* is parallel to the left open surface 91B of the cover 91 and perpendicular to the mounting surface 90*a*. In short, the heatsink 98 may be mounted on the mounting surface 90*a* such that the first wall 981*a* extends in the top-bottom direction, as well as in the front-rear direction. In this configuration, the heatsink 98 (e.g., the first wall 981*a*) may be disposed between the left open surface 91B of the cover 91 and the rectifier diode 951 in the left-right direction.

[Technical Improvement of Illustrative Embodiment]

The electronic module of the image forming apparatus 1 includes the power supply board 90, the left frame 12, and the cover 91. The power supply board 90 has the mounting surface 90*a* on which electronic components 95 are mounted. The left frame 12 may include non-flame-retardant resin. The left frame 12 extends in a direction perpendicular to the mounting surface 90*a* and supports a left end portion of the power supply board 90 including the left side 902. The cover 91 may include metal. The cover 91 extends in a direction parallel to the rear side 903 and front side 904 of the power supply board 90. The rear and front sides 903 and 904 extend in a direction intersecting or abutting the left side 902. The cover 91 is disposed above the electronic components 95 and the mounting surface 90*a*, covering or surrounding the electronic components 95 and the mounting surface 90*a*. The power supply board 90 includes a heatsink 97, 98 including at least one wall 971, 981, and the electronic components 95 including a heat generating component, e.g., the rectifier diode 951. The heatsink 97, 98 may be mounted on a portion of the mounting surface 90*a* adjacent to the left side 902 of the power supply board 90 (e.g., a left end portion of the power supply board 90). The rectifier diode 951 may be attached or screwed to a wall 971, 981 of the heatsink 97, 98. The heatsink 97, 98 further includes a shade portion 972, 982 provided at at least one wall 971, 981 such that the shade portion 972, 982 is located between the cover 91 and the rectifier diode 951 in a direction perpendicular to the mounting surface 90*a*.

The above-described configurations may reduce or eliminate a region affected by the heat from the rectifier diode 951 even if the left frame 12, which may be located close to the rectifier diode 951, includes non-flame-retardant resin. Use of non-flame-retardant resin for the left frame 12 may reduce the costs of the electronic module.

Further, as compared with a heatsink that does not include a shade portion, the heatsink 97, 98 may allow the rectifier diode 951 to be located closer to the left frame 12, which may be made of non-flame-retardant resin. This may require less space in the electronic module.

The cover 91 has the right open surface 91A and the left open surface 91B on right and left ends of the cover 91, respectively. The open surfaces 91A and 91B are parallel to the left frame surface 121 of the left frame 12. The right open surface 91A has the right opening 911. The left open surface 91B has the left opening 912. The heatsink 97, 98 may be mounted on the mounting surface 90*a* such that the wall 971, 981*a* of the heatsink 97, 98 is perpendicular to the open surfaces 91A and 91B and the mounting surface 90*a*.

This configuration may allow air flow into or out of the cover 91 through the opening 911 or 912, thereby effectively radiating heat away from the wall 971, 981*a*. Accordingly, the left frame 12 disposed facing the left opening 912 of the cover 91 may be less affected by the heat from the rectifier diode 951. This may allow the left frame 12 to include non-flame-retardant resin, thereby reducing the costs of the electronic module. The rectifier diode 951 attached to the wall 971, 981*a* may be located close to or adjacent to the cover 91. This may reduce or eliminate a region affected by the heat from the rectifier diode 951, so that the rectifier diode 951 may be located close to the left opening 912 (e.g., the distance between the rectifier diode 951 and the left opening 912 is minimized). This may require less space in the electronic module.

The cover 91 has the left open surface 91B on the left end thereof. The left open surface 91B is parallel to the left frame surface 121 of the left frame 12. The left open surface 91B has the left opening 912. The heatsink 97, 98 may be mounted on the mounting surface 90*a* such that the wall 971, 981*a* of the heatsink 97, 98 is parallel to the left open surface 91B and perpendicular to the mounting surface 90*a*.

Accordingly, the left frame 12 disposed facing the left opening 912 of the cover 91 may be less affected by the heat from the rectifier diode 951. This may allow the left frame 12 to include non-flame-retardant resin, thereby reducing the costs of the electronic module. The left frame 12 made of non-flame-retardant resin may not necessarily be spaced from the left opening 912 of the cover 91. This configuration may require less space in the electronic module.

The heatsink 98 may include the walls 981 including the first wall 981*a* and the second wall 981*b*. The first wall 981*a* may attach to the rectifier diode 951. The second wall 981*b* is perpendicular to the first wall 981*a* and the mounting surface 90*a*. The shade portion 982 may be provided by bending or curving at least one of the first wall 981*a* and the second wall 981*b*.

Each of the shade portion 982 and the second wall 981*b* may function as a shield or a barrier against the heat from the rectifier diode 951. This configuration may further reduce or eliminate a region affected by the heat from the rectifier diode 951. Use of non-flame-retardant resin for the left frame 12 may reduce costs of the electronic module. The heatsink 98 including the second wall 981*b* may allow the rectifier diode 951 to be located closer to the left frame 12, as compared with a heatsink that does not include a second wall 981*b*. This may require less space in the electronic module.

The shade portion 972, 982 is angled, relative to a direction parallel to the mounting surface 90*a*, in a direction away from the mounting surface 90*a*, from a portion of the wall 971, 981 at which the shade portion 972, 982 is provided.

An angle of the shade portion 972, 982 relative to the wall 971, 981a may be appropriately determined to allow the shade portion 972, 982 to function as a shield or a barrier against the heat from the rectifier diode 951. The shade portion 972, 982 as appropriately angled may effectively reduce or eliminate a region affected by the heat generated from the rectifier diode 951 and may allow the left frame 12 to use or include non-flame-retardant resin. This may need less costs of the electronic module.

What is claimed is:

1. An electronic module, comprising:
   a circuit board having a mounting surface, the circuit board having a first side and a second side perpendicular to the first side;
   a heat generating component mounted on the mounting surface of the circuit board;
   a frame including non-flame-retardant resin, the frame extending in a direction perpendicular to the mounting surface and supporting the first side of the circuit board, the frame having a frame surface;
   a cover including metal, the cover extending in a direction parallel to the second side of the circuit board and covering the heat generating component and the mounting surface; and
   a heatsink mounted on the mounting surface of the circuit board adjacent to the first side, the heatsink including at least one wall including a particular wall to which the heat generating component is attached,
   wherein the heatsink further includes:
       a shade portion provided at the at least one wall, the shade portion located between the cover and the heat generating component in a direction perpendicular to the mounting surface.

2. The electronic module according to claim 1, wherein the cover includes an open surface at an end thereof in a direction parallel to the second side of the circuit board, the open surface is parallel to the frame surface of the frame, the open surface has an opening, and the particular wall of the heatsink is perpendicular to the open surface and the mounting surface.

3. The electronic module according to claim 1, wherein the cover includes an open surface at a particular end thereof in a direction parallel to the second side of the circuit board, the particular end corresponding to the first side of the circuit board,
   the open surface has an opening, and
   the particular wall of the heatsink is parallel to the open surface and is perpendicular to the mounting surface.

4. The electronic module according to claim 1, wherein the at least one wall of the heatsink includes a first wall and a second wall that is perpendicular to the first wall and the mounting surface,
   the first wall is the particular wall that attaches to the heat generating component, and
   the shade portion is a bent portion integral with the at least one of the first wall and the second wall.

5. The electronic module according to claim 1, wherein the shade portion is angled, relative to a direction parallel to the mounting surface, in a direction away from the mounting surface, from a portion of the at least one wall at which the shade portion is provided.

6. The electronic module according to claim 1, wherein the heat generating component includes a rectifier diode.

7. The electronic module according to claim 1, wherein the circuit board includes a power supply board.

8. A power supply circuit board module, comprising:
   a circuit board having a mounting surface;
   a first frame including flame-retardant resin;
   a second frame made of non-flame-retardant resin;
   a rectifier diode mounted on the mounting surface of the circuit board, wherein a distance between the rectifier diode and the second frame is less than a distance between the rectifier diode and the first frame;
   an upper cover extending between the first frame and the second frame and connected to the first frame and the second frame; and
   a heatsink mounted on the mounting surface of the circuit board, the heatsink including a particular wall extending in a direction perpendicular to the mounting surface toward the upper cover, the rectifier diode being attached to the particular wall,
   wherein the heatsink further includes:
       a shade portion extending from the particular wall such that the shade portion is located between the upper cover and the rectifier diode in the direction perpendicular to the mounting surface.

9. The power supply circuit board module according to claim 8, wherein the particular wall is disposed between the rectifier diode and the second frame.

10. The power supply circuit board module according to claim 9, wherein the shade portion extends from the particular wall in a direction away from the mounting surface such that the shade portion is angled relative to a direction parallel to the mounting surface.

11. The power supply circuit board module according to claim 8, wherein the rectifier diode is attached to the particular wall in a direction perpendicular to a particular direction extending from the first frame toward the second frame.

12. The power supply circuit board module according to claim 11, wherein the shade portion extends from the particular wall in a direction away from the mounting surface such that the shade portion is angled relative to a direction parallel to the mounting surface.

13. The power supply circuit board module according to claim 11, further comprising:
   a fan configured to make air flow in the particular direction.

14. The power supply circuit board module according to claim 13, wherein the fan is closer to the first frame than to the second frame.

15. The power supply circuit board module according to claim 11, further comprising:
   a further wall extending in the direction perpendicular to the particular direction, the further wall extending from the particular wall and being located between the rectifier diode and the second frame.

16. The power supply circuit board module according to claim 8, wherein the heatsink is in contact with the mounting surface of the circuit board.

* * * * *

UNITED STATES PATENT AND TRADEMARK OFFICE
CERTIFICATE OF CORRECTION

| | | |
|---|---|---|
| PATENT NO. | : 11,083,103 B2 | Page 1 of 1 |
| APPLICATION NO. | : 16/295481 | |
| DATED | : August 3, 2021 | |
| INVENTOR(S) | : Taiki Hashizume et al. | |

It is certified that error appears in the above-identified patent and that said Letters Patent is hereby corrected as shown below:

On the Title Page

Item (73) Assignee: Delete "KA BUSH IKI" and replace with -- KABUSHIKI --.

Signed and Sealed this
Fourteenth Day of September, 2021

Drew Hirshfeld
*Performing the Functions and Duties of the*
*Under Secretary of Commerce for Intellectual Property and*
*Director of the United States Patent and Trademark Office*